(12) United States Patent
Gibson et al.

(10) Patent No.: US 6,495,205 B1
(45) Date of Patent: Dec. 17, 2002

(54) LINEAR EXTRUSION COATING SYSTEM AND METHOD

(75) Inventors: Gregory M. Gibson, Dallas; Altaf A. Poonawala, Irving; Rene Soliz, Dallas; Ocie T. Snodgrass, Garland, all of TX (US)

(73) Assignee: FAStar, Ltd., Dallas, TX (US)

( * ) Notice: Subject to any disclaimer, the term of this patent is extended or adjusted under 35 U.S.C. 154(b) by 0 days.

(21) Appl. No.: 09/148,463

(22) Filed: Sep. 4, 1998

Related U.S. Application Data
(60) Provisional application No. 60/074,973, filed on Feb. 17, 1998, provisional application No. 60/074,970, filed on Feb. 17, 1998, and provisional application No. 60/074,974, filed on Feb. 17, 1998.

(51) Int. Cl.[7] ................................................. B05D 1/42
(52) U.S. Cl. .................. 427/240; 427/300; 427/420; 427/421; 427/425; 118/52; 118/407; 118/421; 118/501
(58) Field of Search ............................ 427/240, 385.5, 427/430.1, 420, 425, 300, 421; 118/52, 70, 407, 320, 421, 501

(56) References Cited

U.S. PATENT DOCUMENTS

| | | | | |
|---|---|---|---|---|
| 4,024,835 A | * | 5/1977 | Scheu et al. | 118/52 |
| 5,298,288 A | * | 3/1994 | Curry, II et al. | 427/379 |
| 5,626,913 A | * | 5/1997 | Tomoeda et al. | 427/240 |
| 5,919,520 A | | 7/1999 | Tateyama et al. | 427/240 |
| 6,076,979 A | * | 6/2000 | Mimasaka et al. | 396/604 |

* cited by examiner

*Primary Examiner*—Shrive P. Beck
*Assistant Examiner*—Kirsten A. Crockford
(74) *Attorney, Agent, or Firm*—Henry L. Ehrlich; Winstead Sechrest & Minick P.C.

(57) ABSTRACT

Extrusion coating of circular and other substrates is taught with a linear extrusion head in a linear motion utilizing a chuck assembly providing a coating bead forming surface. The coating bead forming surface allows for the coating bead to be at a steady state at all points at which the extrusion head interfaces with the substrate during the linear motion. Various configurations of chuck assemblies are taught to allow for improved handling of the substrate, deploying of the chucks in existing machinery, and simplified cleaning of the coating bead forming surface. Additionally, adaptation of the chuck assembly for discouraging undesired migration of the coating material is taught.

42 Claims, 7 Drawing Sheets

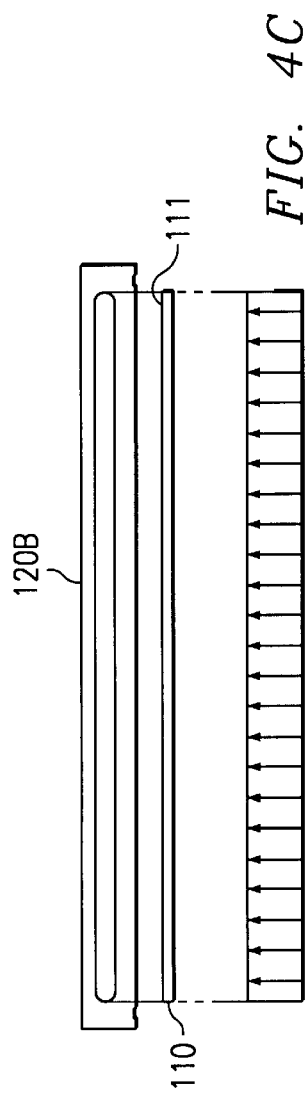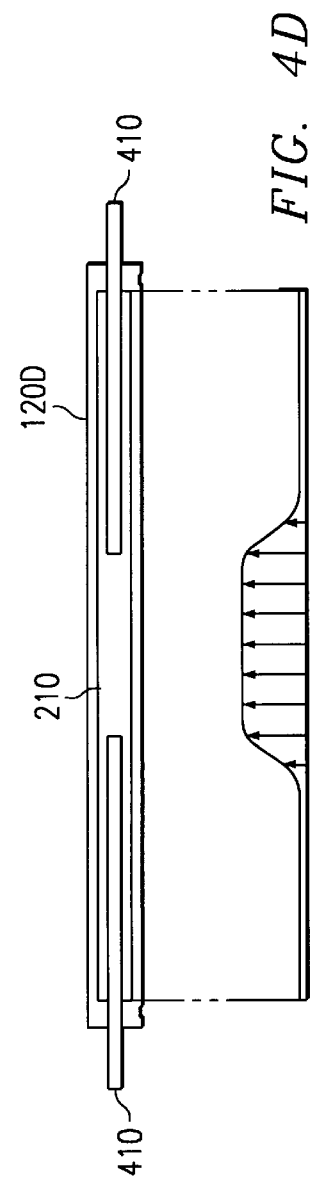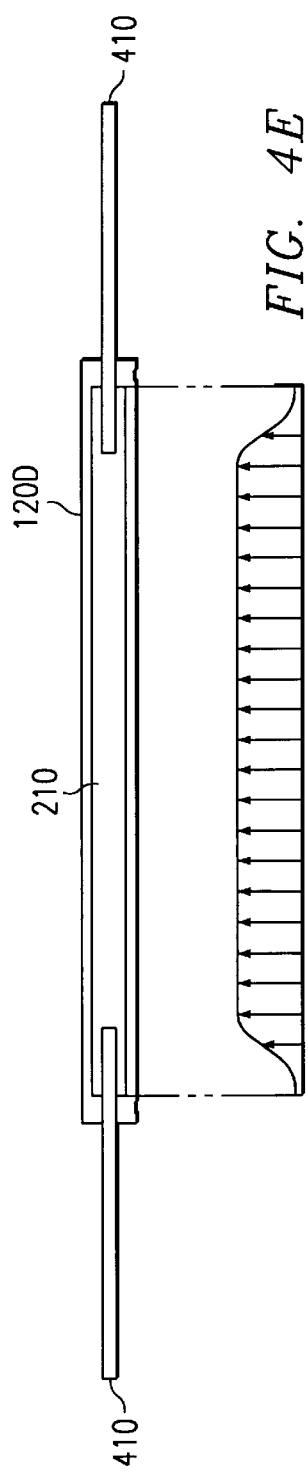

LINEAR EXTRUSION COATING SYSTEM AND METHOD

REFERENCE TO RELATED APPLICATIONS

This application claims the benefit of U.S. Provisional Applications Serial No. 60/074,973 filed Feb. 17, 1998, entitled "METHOD AND SYSTEM FOR WATER COATING USING RELATIVE LINEAR MOTION BETWEEN AN EXTRUSION DIE HEAD AND A SUBSTRATE", Provisional Application Ser. No. 60/074,970 filed Feb. 17, 1998, entitled "METHOD AND SYSTEM FOR EXTRUDE AND SPIN COATING USING A GRADIENT DIE HEAD AND RELATIVE MOTION BETWEEN THE DIE HEAD AND A SUBSTRATE", and Provisional Application Ser. No. 60/074,974 filed Feb. 17, 1998, entitled "METHOD AND SYSTEM FOR EXTRUDE AND SPIN COATING USING RELATIVE CONCENTRIC OR SPIRAL MOTION BETWEEN A DIE HEAD AND A SUBSTRATE", the disclosures of which are incorporated herein by reference.

TECHNICAL FIELD OF THE INVENTION

This invention relates to the precision coating of surfaces and more particularly to extrusion coating substrates presenting a non-linear leading edge to provide a uniform, precision, coating.

BACKGROUND OF THE INVENTION

It is often necessary or desired to provide a coating of a particular substrate. For example, in the micro-electronics industry it is often desired to coat a substrate used in the manufacture of integrated circuits for further processing. Often it is required that such coatings be applied in a very thin coat, such as a thin coat of photoresist used in masking and etching a silicon substrate for manufacturing integrated circuits, which is uniform across the entire surface of the substrate. However, as the coating is so thin, very minute variances in its thickness may not be acceptable.

Accordingly, the prior art has relied upon various methods for providing a continuous, uniform, thin coating of a substrate. However, in the past these methods have been inefficient and, therefore, prone to waste.

For example, a commonly relied upon prior art method of coating a substrate is spin coating. Here a coating material, typically suspended in a solvent based fluid, is deposited in a pool on the substrate to be coated, generally at or near the center of the surface to be coated. Thereafter, the substrate itself is rotated at a high speed about an axis normal to the surface to be coated. Centrifugal forces created by the rotation of the substrate cause the pool of material to migrate toward the edges of the substrate. Accordingly, rotating the substrate for a sufficient length of time at a proper speed will result in a substantially uniform coating having a desired thickness, where a sufficiently ductile coating material is present.

However, the spin method of coating the substrate necessarily results in an amount of coating material being expelled from the surface to be coated. In practice, the expelled portion of coating material may be as great as 90–95% of the material initially deposited in the pool on the substrate. Typically this material which is expelled from the surface is lost as there are often very stringent purity requirements and/or the solvents suspending the material being quick to evaporate making their recycling difficult or impossible. Moreover, spin coating is generally not completely effective in evenly distributing a very viscous coating material.

These coating materials are generally very expensive and therefore the waste that occurs in coating the substrate can be an important consideration. Accordingly, although providing a reliable method for achieving a uniform coating of a substrate, the prior art spin methods introduce an undesired level of waste. Moreover, the amount of waste increases as the size of the substrate increases causing such inefficiencies to be increasingly unpalatable as the industry moves to larger and larger substrates, e.g., 3.5 generation LCD technology and 12 inch silicon wafers.

It should also be appreciated that the excess material discharged from the above mentioned spin technique presents, at a minimum, a requirement for the subsequent handling and cleanup of this substantial amount of unused material. Because of purity of material requirements this discharged material must often be disposed of. However, often times this material, and/or its solvent carrier, are hazardous materials and must be handled with extreme care as well as being disposed of in accordance with stringent guidelines. Likewise, often the solvents utilized in cleanup of such discharged material are hazardous, thus compelling their restricted use.

Additionally, the prior art spin methods of coating the substrate can result in the outer edges and/or the back surface of the substrate also being coated by the material. This can be undesired as subsequent handling of the substrate, having its edges coated, may result in the chipping and peeling of the coating on these edges which may continue to the surface for which a uniform contamination coating is desired. Moreover, coating of these surfaces may also result in the contamination of the surface desired to be coated.

Furthermore, the solvents carrying the desired coating materials in suspension may be highly unstable and, therefore, prone to rapid dissipation, such as through evaporation. Accordingly, uneven coating may result in the aforementioned spin technique where, for example, an appreciable time between depositing the pool of material for spinning, or where the substrate surface to be coated is large.

The above mentioned spin method of coating a substrate, although acceptable for use in coating certain shaped substrates, such as a small circular silicon wafer used in manufacturing integrated circuits, may not provide acceptable results in coating other shaped substrates. For example, spin coating a square or irregularly shaped substrate may result in windage problems when the substrate is spun which cause the coating material to cure in a non-uniform coating. Likewise, because of longer distances between the center of the substrate, where the pool of coating material is deposited prior to spinning, and the outer edges associated with the substrate's irregular circumference, spinning the coating material onto these substrates may not provide uniform coverage. Similarly, a large silicon wafer may present sufficient distances between the center of the substrate and the outer edges, although presenting a consistent distance, that uniform coverage may be impossible by spin coating alone due to the drying of the coating material as it migrates out along the radius of the substrate being spun. Moreover, due to the fact that the velocity of the outside edge of the large wafer may be relatively large, windage related patterns in the coating may result.

Accordingly, a need exists in the art for a system and method for providing a uniform coating of a desired thickness on a substrate, including substrates of various shapes and sizes, while providing efficient use of a coating material.

A further need exists in the art for the system and method for coating a substrate to minimize coating of surfaces of the substrate which are not desired to be coated, such as a circumferential edge of a surface to be coated.

A still further need exists in the art for the system and method for coating a substrate to provide for simple and efficient cleanup of any excess coating material in order to reduce the time and effort required in cleaning such excess material as well as reduce the amounts of solvents required in such cleanup.

SUMMARY OF THE INVENTION

These and other objects, features and technical advantages are achieved by a system and method which utilizes an extrusion or other controlling delivery process to deliver a coating material upon a substrate surface in a uniform coating of a predetermined thickness. After initial deposit of the coating material upon the substrate surface by the extrusion process, the substrate may be spun in order to provide a more uniform coating or a coating of a desired thickness. Alternatively, such as (1) where a coating material is initially deposited in a very viscous state or (2) where a more thin coating is desired than is consistently producible through extrusion alone or for surfaces presenting a high aspect ratio surface to be coated. Spinning of the substrate may be omitted in producing the designed uniform coating according to the present invention.

A preferred embodiment of the present invention utilizes an extrusion die or head providing linear, or substantially linear, extrusion of a coating material at a precisely controlled rate, i.e., the extrusion head moves in a linear motion with respect to the surface to be coated. By selecting the extrusion head presenting an extrusion orifice to be of a sufficient width to correspond to a full width of the substrate to be coated, a single pass of the extrusion head along the substrate, a single pass of the substrate with respect to the extrusion head, or a combination of both, may be utilized to provide complete coating of the substrate. Accordingly, the coating on the substrate may be of a very uniform thickness and/or consistency as no overlap of extruded material or seams between successive co-located extrusion coatings are required to fully coat the surface of the substrate.

Depositing the coating material through extrusion according to the present invention preferably relies upon the use of a coating material in a liquid, or otherwise highly ductile, state, such as a coating material suspended or dissolved in a liquid carrier, which hardens or cures after extrusion, such as by a solvent carrier evaporating. Accordingly, a coating bead may be formed between lips of the extrusion orifice and the substrate surface to be coated, which through capillary action and/or controlled delivery of the liquid coating material to the extrusion head delivers a precisely controllable amount of the material through the extrusion orifice. Therefore, the relative motion of the extrusion head with respect to the substrate surface deposits a desired coating, i.e., wet film, of the material.

It should be appreciated that the coating bead must be precisely controlled if a coating of uniform thickness is to be formed. Accordingly, the relative movement of the extrusion head and the substrate should be carefully controlled to provide for a smooth continuous motion. Additionally, the coating bead should be substantially at a steady state throughout its contact with the substrate surface. Otherwise, the coating may include areas of nonuniform thickness or other inconsistencies in the coating.

The preferred embodiment of the present invention is adapted to provide for the extrusion coating of substrates having a circumferential edge or periphery which does not correspond to the shape of the extrusion head, i.e., utilizing a substantially linear extrusion head with a substrate having a circular, elliptical, or irregular shape. Therefore, relying on a single pass of the extrusion head, having an extrusion orifice width corresponding to the widest portion of the substrate as traversed by the extrusion head, presents areas in which the extrusion orifice does not correlate with the surface of the substrate. This mismatch presents problems in depositing the desired uniform coating. For example, where the substrate is circular and the extrusion head is linear, initially forming the coating bead at an edge of the substrate, in order to coat the substrate in a single pass, can be problematic.

Likewise, the initially formed coating bead may only correspond to a reduced portion of the extrusion orifice, causing coating material to accumulate, such as in drips or other accumulations of material. These accumulations of material may cling to the extrusion head and, upon coming into contact with the surface to be coated, result in areas of nonuniform thickness or other inconsistencies in the coating.

Accordingly, a preferred embodiment of the present invention is adapted to present a means for capturing material which might otherwise cause nonuniform coating of a surface, such as a coating bead forming surface upon which the coating bead may be formed and/or substantially reach a steady state prior to coming into contact with the surface of the substrate to be coated. The coating bead forming surface may present a surface, which combined with that of the substrate surface to be coated, substantially corresponds to the extrusion head at all positions throughout the relative motion of the extrusion head and the substrate surface.

Alternatively, the coating bead forming surface may present a surface, which combined with that of the substrate surface to be coated, initially corresponds to the extrusion head at positions of the relative motion of the extrusion head and the substrate surface. However, upon establishing a coating bead sufficiently wide to coat the widest portion of the substrate as traversed by the extrusion head, the coating bead forming surface may be discontinued.

Another alternative embodiment of the present invention utilizes a coating bead forming surface presenting a sufficient area upon which to establish a portion of a coating bead and that portion of the bead reaching a steady state, i.e., drawing the material accumulated in the areas of the extrusion orifice initially corresponding to neither the bead forming surface nor the substrate surface and providing sufficient surface upon which to establish a consistent flow of coating material from the extrusion orifice, prior to the relative motion of the extrusion head and the substrate surface causing that portion of the coating bead coming into contact with the substrate surface. This preferred embodiment allows a minimum amount of coating bead forming surface to be utilized while still providing a uniform coating on the substrate when using linear extrusion to coat a substrate surface which does not correspond to the extrusion head at all positions.

Additionally, or alternatively, the use of a gradient flow extrusion head, whether a variable or fixed gradient, may be utilized according to a preferred embodiment of the present invention. For example, an extrusion head having a fixed gradient of material delivery across the extrusion orifice corresponding to the surface area to be coated by each portion of the head may be utilized. Such a head may utilize a gradient shim disposed between the extrusion die halves in order to establish a graduated extrusion orifice as desired.

Similarly, an extrusion head adapted to adjust the flow of coating material in connection with the surface area to be coated corresponding to the extrusion orifice may be utilized. For example, by flexing of the extrusion head to increase/decrease the gap between the extrusion head and surface to be coated to discourage/encourage the forming of a coating bead or extrusion of material at particular points in the relative motion of the extrusion head may be contained. Likewise, controlled delivery of coating material to portions of the extrusion orifice, such a through fluid flow restrictions in the manifold of the extrusion head, may be used to control delivery of the coating material to correspond to the surface to be coated throughout the relative motion of the extrusion head.

As the thickness of the coating formed by the extrusion of the present invention is to be precisely controlled and the coating bead is preferably to be substantially at a steady state when coming into contact with the substrate surface to be coated, the bead forming surface is preferably cleaned of coating material prior to its use in subsequent extrusion coating of a substrate. However, due to the very thin coating applied by the present invention, it is anticipated that cleaning of the bead forming surface may be performed only after a number of cycles determined to result in undesired coating characteristics. Accordingly, in either case, the coating material will not build up to a point sufficient to cause irregularities in the transition region between the bead forming surface and the substrate surface.

Cleaning of the bead forming surface may include any of a number techniques or a combination thereof. For example, the bead forming surface may be coated with a non-wetting substance, such as TEFLON, in order to be more easily cleaned. However, it should be appreciated that such a non-wetting coating must not be too non-wetting as it is desired that a coating bead be formed thereon. Additionally, or alternatively, the bead forming surface may be adapted to be suitable for automated cleaning such as by spinning and/or immersion in cleaning solution. Likewise, cleaning techniques such as solvent spray/stream clean, heated solvent spray/stream clean, application of a cleaning solvent followed by a rinsing or neutralizing solvent, mechanical action, such as a brush, with or without the aid of a solvent, use of ultrasonic devices, such as an ultrasonic nozzle for application of solvent, freezing the coating material, such as by introduction of liquid $CO_2$, or other low temperature technique for simplified removal of the material, and/or the use of disposable or cleanable shims, or "tear-off," that provide the bead forming surface to be cleaned.

A technical advantage of the present invention is that a system and method for providing a uniform coating of a desired thickness on a substrate, including substrates of various shapes and sizes is provided. A further technical advantage is that the present invention provides for the efficient use of coating materials deposited thereby. A yet further technical advantage of the present invention is that uniform coatings of a material initially in a very viscous fluid state may be accomplished.

A still further technical advantage of the present invention is that coating of surfaces of the substrate which are not desired to be coated is minimized.

Additionally, a technical advantage of the present invention is that simple and efficient cleanup techniques may be used to remove any excess coating material thereby reducing the time and effort required in cleaning such excess material as well as reducing the amounts of solvents required in such cleanup.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4B and 4C show an elevation view of a flexible extrusion head;

FIGS. 4D and 4E show an elevation view of an extrusion head adapted for variable delivery of coating material;

DETAILED DESCRIPTION OF THE INVENTION

The present invention provides a system and method by which linear or substantially linear relative motion may be utilized in providing a uniform coating having a desired thickness on a substrate even where the shape of the substrate does not correspond to the linear coating motion. Directing attention to FIG. 1, a plan view of substrate 110 presenting circular surface 111 is shown. Substrate 110 may be a silicon wafer of any size, such as may be used in the production of integrated circuits for example. Extrusion head 120, having a length substantially matching the diameter of circular surface 111, may be moved in the direction of the arrows, as indicated by the phantom representation, in order to deposit coating 130. Accordingly, a single pass of extrusion head 120 may be used to fully coat circular surface 111 with coating 130.

Relative movement of extrusion head 120 with respect to substrate 110 may be provided by a gantry mechanism well known in the art. Of course, any means by which controlled relative movement of extrusion head 120 with respect to substrate 110, such as mechanisms employing stepper motors or servos, may be utilized according to the present invention. In the preferred embodiment extrusion head 120 is moved relative to a fixed or stationary substrate 110 through the use of the aforementioned gantry mechanism. Holding of substrate 110 in a stationary position is preferably accomplished through the use of a chuck which firmly holds substrate 110 while presenting an unobstructed surface to be coated, such as a vacuum chuck well known in the art. Such a chuck, although providing the stationary positioning of substrate 110 during movement of extrusion head 120, may be adapted to provide motion of substrate 110, such as during loading and/or unloading. Additionally, the chuck may be adapted to provide controlled spinning of substrate 110 while held thereon in order to distribute/further distribute the coating material upon the coating surface.

Figure 1:
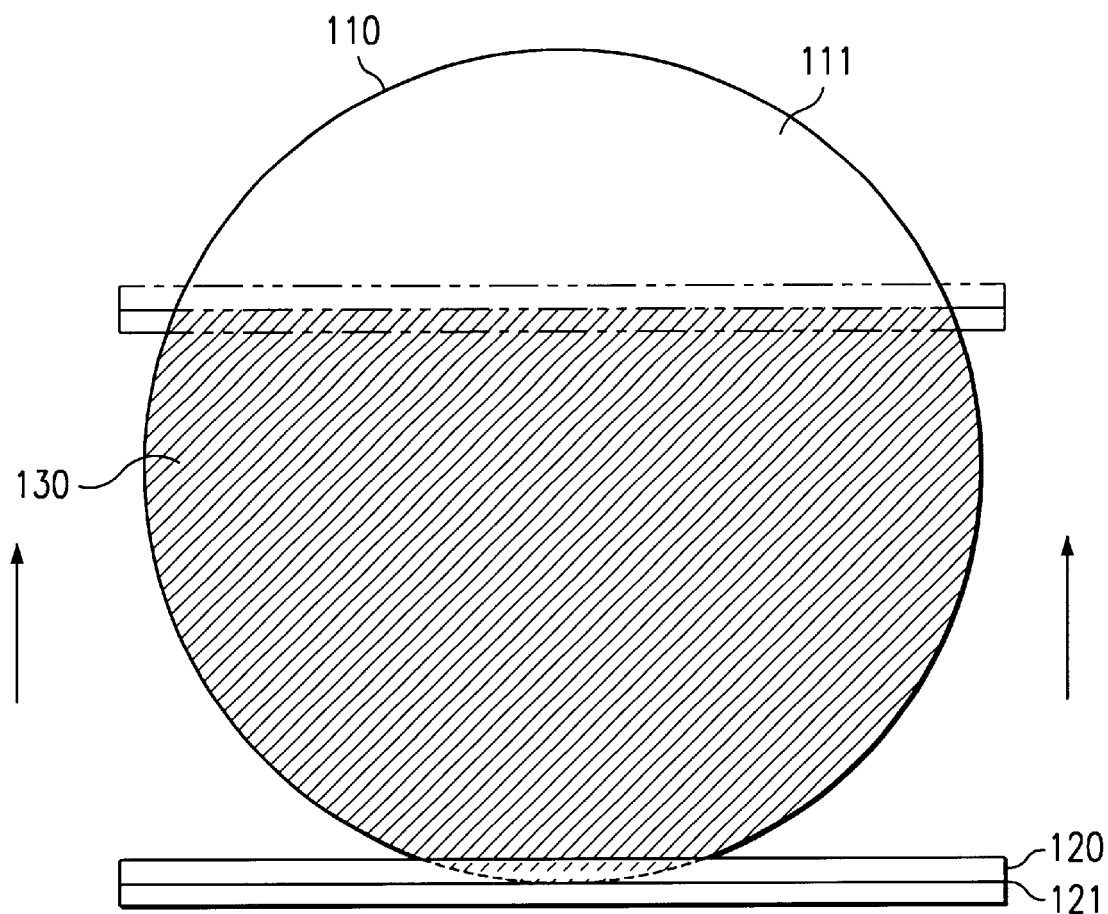
FIG. 1 shows a plan view of a circular substrate and an extrusion head disposed for linear coating thereof.
Figure 2:
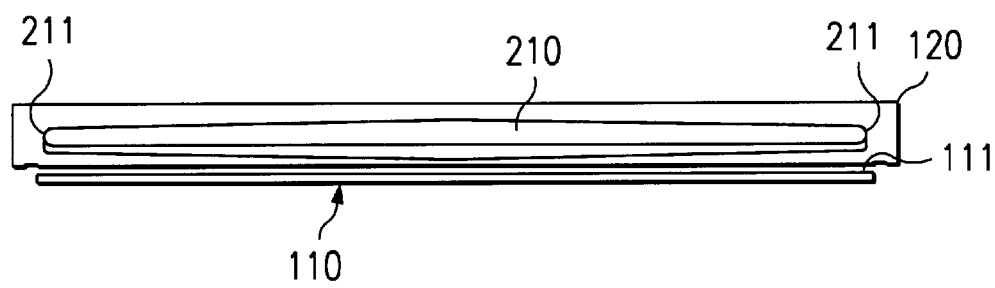
FIG. 2 shows an elevation view of the substrate and extrusion head of FIG. 1.

Directing attention to FIG. 2, an elevation view of substrate 110 and extrusion head 120 is shown. Preferably, the extrusion head is composed of two flat plates of material separated by a shim of a desired thickness in order to define a precise slit opening for the extrusion of material, i.e., an extrusion orifice. In the view of FIG. 2, extrusion head 120 is illustrated as having extrusion material manifold 210 exposed, such as if extrusion head 120 has been separated along seam 121 of FIG. 1. It shall be appreciated that this representation is utilized herein to aid in the understanding of the present invention and may not be an accurate reflection of the appearance of extrusion head 120 in actual use. Moreover, it shall be appreciated that the present invention is not limited to use of the above described extrusion head and may in fact utilize various means for delivering coating material over a defined area at a precisely controlled code.

In operation, coating material is provided to extrusion material manifold 210 for delivery from extrusion head 120 to circular surface 111 through an extrusion orifice (not shown) of extrusion head 120. Such an extrusion orifice may be formed to allow the extrusion material to flow from extrusion material manifold 210 of extrusion head 120 at a controlled or predetermined rate, such as through placing a spacer or shim (as described above) at seam 121 to allow a gap having a predetermined thickness to remain between the two die halves of extrusion head 120.

The extrusion orifice of extrusion head 120 preferably corresponds to a largest dimension of substrate 110 as traversed by extrusion head 120. Accordingly, the extrusion orifice of the illustrated embodiment of extrusion head 120 substantially corresponds to edges 211 of extrusion material manifold 210. Therefore, the entire surface 111 may be coated in a single pass of extrusion head 120.

Figure 3:
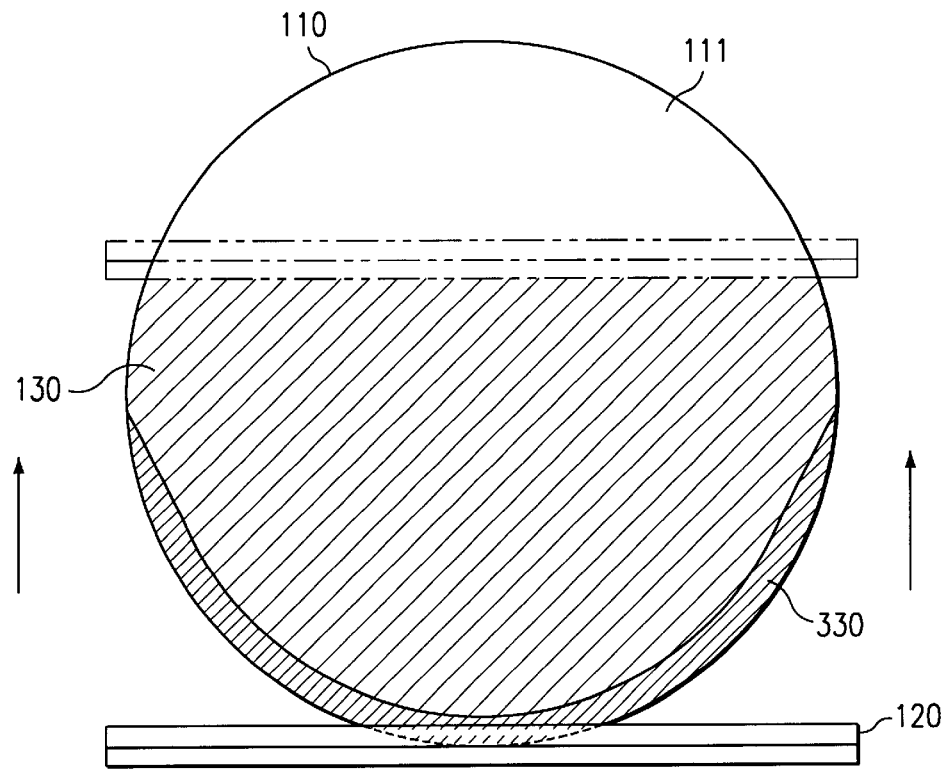
FIG. 3 shows a substrate and extension head of FIG. 1 having a buildup of coating material caused by linear extrusion.

However, it should be appreciated that when extrusion head 120 is at a position with respect to substrate 110 other than at the center, portions of the extrusion orifice may not correspond to circular surface 111, i.e., portions of the extrusion head and its associated extrusion orifice may over hang the substrate. Accordingly, as coating material is extruded from the extrusion orifice to coat the portions of substrate 110 corresponding thereto, coating material may accumulate, such as in drips or other accumulations of material, at portions of the extrusion orifice not corresponding to circular surface 111. These accumulations of material may cling to extrusion head 120 and, upon coming into contact circular surface 111 as extrusion head 120 moves relative thereto, result in areas of nonuniform thickness or other inconsistencies in coating 130. Such a nonuniform coating is illustrated in FIG. 3 where horseshoe area 330 having a thickness greater than that of the remaining coating 130 due to the accumulation of coating material on extrusion head 120 prior to its correspondence to circular surface 111 is shown.

As illustrated in FIG. 1, extrusion head 120 is preferably initially positioned at or near the edge of substrate 110. By carefully controlling the dispense rate of coating material in extrusion head 120, a coating bead is formed only at the interface between extrusion head 120 and circular surface 111, i.e., the point(s) at which the extrusion orifice corresponds to circular surface 111. This phenomenon occurs as a result of capillary and other forces within the coating bead itself and is further shown and described in commonly assigned U.S. Pat. No. 4,696,885 issued Sep. 29, 1987 in the name of Vijan, the disclosure of which is incorporated herein by reference.

Once the coating bead is formed, extrusion head 120 is moved linearly across substrate 110. During this movement, the dispense rate of coating material from the extrusion orifice may be held constant, or it may be increased as the substrate area to be covered increases, i.e., a larger or more portions of circular surface 111 correspond to the extrusion orifice. Thus, in the latter case, as the head traverses the midpoint of circular surface 111, the dispense rate may be decreased.

Figure 4A:
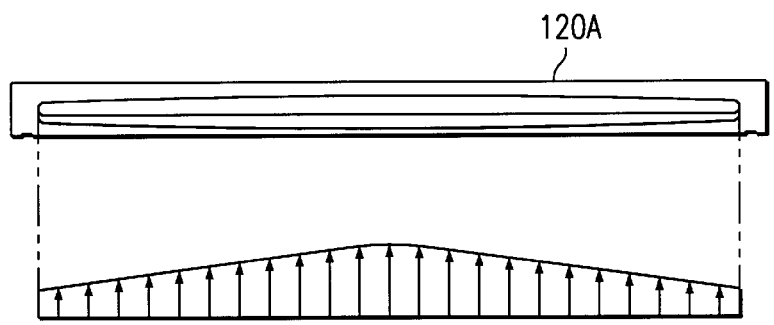
FIG. 4A shows an elevation view of an extrusion head and corresponding gradient flow diagram.

Of course, other variations in the dispense rate may be implemented as well as variations in the speed at which extrusion head 120 traverses circular surface 111 to provide a desired coating. For example, an alternative embodiment of extrusion head 120 is illustrated as gradient flow extrusion head 120A in FIG. 4A. Here, the extrusion orifice and/or extrusion material manifold 210 are adapted to provide a graduated flow of coating material. Accordingly, the center portion of extrusion head 120A, which traverses the largest portion of circular surface 111 when moved linearly, deposits a larger portion of coating material than does either distal end of extrusion head 120A. This embodiment provides for reduced accumulation of coating material upon the portions of extrusion head 120A which do not correspond to circular surface 111 and, therefore, improves the uniformity of the coating deposited thereon from linear movement of extrusion head 120A.

It shall be appreciated that extrusion head 120A, although utilizing capillary action, surface tension, and/or gravity to cause the coating material deposited by the center portion of extrusion head 120A to supplement that deposited by the more distal portions of extrusion head 120A, may result in a coating slightly thicker along the diameter of circular surface 111 orthogonal to extrusion head 120A. Accordingly, a preferred embodiment of the present invention utilizing gradient flow extrusion head 120A includes spinning substrate 110 at a sufficient speed and for a sufficient duration to result in a substantially uniform coating of substrate 110.

Figure 4B:
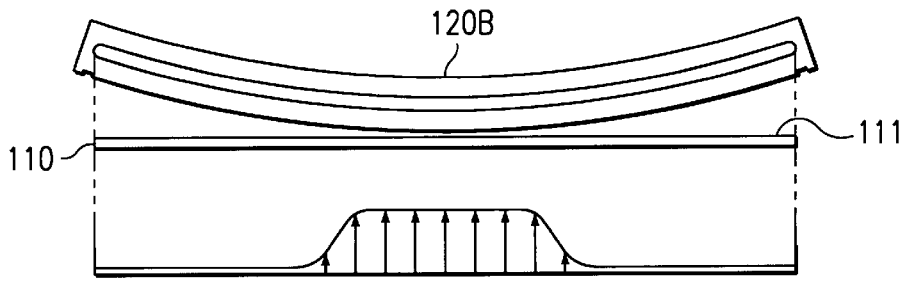

Directing attention to FIG. 4B, another alternative embodiment of an extrusion head is shown as flexible extrusion head 120B. In order to provide a uniform coating, extrusion head 120B is flexed to result in the portions of the extrusion head not corresponding to the surface to be coated to be displaced from the plane parallel to that surface. As the relative movement of extrusion head 120B disposes it over a portion of the surface to be coated which more closely corresponds to the width of extrusion head 120B, it may be flexed accordingly. Shown in FIG. 4C is extrusion head 120B flexed so as to correspond to the center of circular surface 110. The extrusion of material and/or its buildup at portions of extrusion head 120B not corresponding to the surface to be coated is discouraged such as by the flexed portions of the extrusion orifice and/or gravity and/or capillary action causing extruded material to migrate to the portion of the head where the extrusion bead is formed for delivery to the surface to be coated. Accordingly, extrusion head 120B may advantageously be used in combination with the controlled delivery of coating material to the head corresponding to the above described delivery phenomenon associated with the flexible extrusion head to provide a uniform coating.

Directing attention to FIG. 4D, adjustable extrusion head 120D is shown having fluid flow restriction bougies 410. Bougies 410 are inserted into extrusion manifold 210 to substantially fill its area and thus discourage the extrusion of coating material at all but the center portion of extrusion head 120D in FIG. 4D. Accordingly, as adjusted in FIG. 4D, extrusion head 120D provides for extrusion of coating material corresponding to the coating surface as traversed near the beginning or end of the linear relative motion described above with reference to FIG. 1. However, at FIG. 4E bougies 410 have been adjusted in order that extrusion of coating material from extrusion head 120D corresponds to surface 110 more near the center of the linear pass. Of course, bougies 410 may be adjusted independently to correspond to irregular surfaces to be coated.

Preferably, extrusion head 120D includes seals at its distal ends through which bougies 410 pass, in order to prevent the escape of coating material therefrom and/or the introduction of contaminants thereto. Additionally, as contamination of the coating material is a concern in many circumstances where it is anticipated that the present invention will be utilized, the preferred embodiment of extrusion head 1200 is precisely machined so as to prevent or minimize contact of bougies and extrusion head 120D during adjustment. Alternatively, bougies 410 and/or extrusion head 120D are made from or treated with materials which do not readily result in discharge of particulate matter due to surface to surface contact.

It shall be appreciated that any of the above embodiments of the extrusion head may utilize additional extrusion control techniques. For example, a gradient disperse profile, where an initial bead form flow followed by increased flow as the coating area increases and decreases as the coating area decreases, as well as advanced control of extrusion head relative velocity and/or head to substrate distance may be utilized if deemed advantageous.

Figure 5:
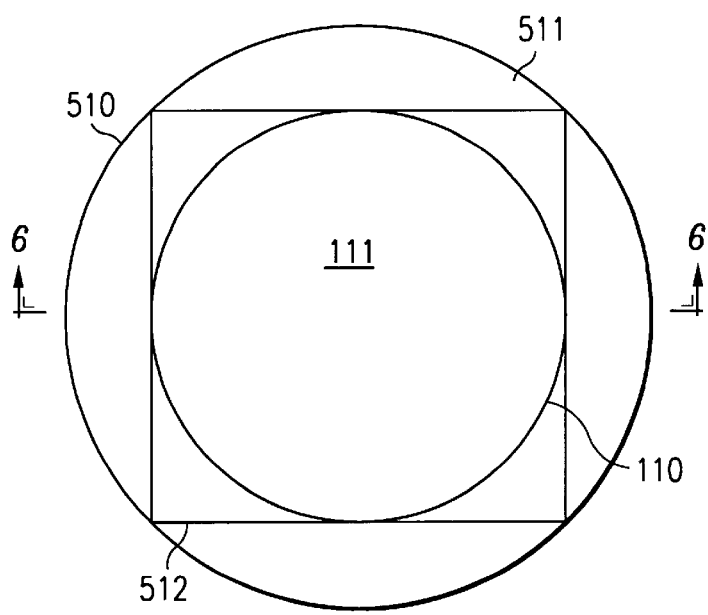
FIG. 5 shows a plan view of the substrate of FIG. 1 disposed in a chuck presenting a bead forming surface of the present invention.

Directing attention to FIG. 5, a preferred embodiment of the present invention providing bead forming surface 511 on chuck 510 is shown in plan view. Accordingly, extrusion head 120 may deposit coating 512 completely coating circular surface 111 of substrate 110 in a single linear motion without accumulation of coating material on extrusion head 120 at portions not corresponding to circular surface 111. Instead, coating 512 is deposited correlating to the length of extrusion head 120 at all points. Accordingly, substrate 110 may be removed from chuck 510 after a single pass of extrusion head 120 having deposited thereon a coating of substantially uniform thickness without further processing.

For example, in a particular application, the coating may be a relatively thick film (e.g., polyimide at 10 microns) and the uniformity requirement may be plus or minus 2%. In such a case further processing, such as spinning substrate 110, may be unnecessary and undesired.

Alternatively, after initial deposit of the coating material as illustrated in FIG. 5, the substrate may be spun in order to provide a more uniform coating or a coating of a desired thickness, such as where a coating material is initially deposited in a relatively thick layer state or where a more thin coating is desired than is consistently producible through extrusion alone. For example, the coating material may be positive photoresist (e.g., photoresist to be deposited in a coating 1.0 micron thick) and the desired uniformity might be plus or minus 0.1% (or less). Here substrate 110 may be positioned within a spin bowl and rotated to generate a desired thickness and uniformity.

However, it should be appreciated that in addition to throwing off coating material, causing the aforementioned waste, spinning is often problematic. For example, where the substrate is large or presents a surface to be coated having features with a high aspect ratio, problems in spinning may arise due to the weight of the substrate or windage created by its spinning. Additionally, the large or high aspect ratio features may cause problems as they interfere with the flow of material from center towards outer edge during the spinning process. Accordingly, the present invention provides a means by which a precisely controlled coating may be deposited on a very large substrate, regardless of the shape thereof or features thereon.

Spinning of substrate 110 may include the spinning of bead forming surface 511. Likewise, the bead forming surface may be spun without substrate 110. This spinning of bead forming surface 511 may be desired in order to remove a portion of the coating material to facilitate further cleaning of bead forming surface 511 for use in subsequent coating of substrates. For example, spinning of bead forming surface 511 may reduce the thickness of the coating material thereon sufficient for use in subsequent coating of substrates with a desired uniform coating and, upon sufficient coating material buildup, bead forming surface 511 may be thoroughly cleaned, such as by solvents or brushing.

Alternatively, substrate 110 may be spun without spinning bead forming surface 511. Directing attention to FIG. 6, an embodiment of chuck 510 is shown wherein a separate chuck portion is utilized to hold substrate 110 for spinning and/or loading and unloading. Here chuck 610 is adapted to hold substrate 110, such as through a vacuum provided through bore 620, and chuck 510 is adapted to receive chuck 610 and substrate 110 such that a substantially continuous surface is presented by the combination of bead forming surface 511 and circular surface 111. By disengaging chuck 510 from chuck 610, as shown in FIG. 7 by the vertical translation arrows, chuck 610, and therefore substrate 110, may be spun separate from chuck 510.

Additionally or alternatively, separation of chuck 510 from chuck 610 may facilitate the cleaning of bead forming surface 511. For example, chuck 510 may be disengaged from chuck 610 and lowered into a pool of solvent for cleaning, such as where it is not desired to immerse chuck 610. Additionally, or alternatively, a plurality of chuck 510 may be utilized in order to provide a clean bead forming surface for coating of a substrate while a bead forming surface having coating material thereon from a previous cycle is cleaned. For example, bead forming surface 511 may be provided through the use of disposable or cleanable shims which may be removed from chuck 510 after receiving coating material. Of course, chucks 510 and 610 may remain engaged when cleaned, or for any other process, if desired.

It shall be appreciated that disengaging chuck 510 from chuck 610 may be utilized for loading and/or unloading of substrate 110 from the chucks as exposed edges and/or portions of a bottom surface of substrate 110 are presented. However, as utilizing the exposed edges of substrate 110 for unloading may cause chipping, or other undesired destruction or contamination, of the coated surface, a preferred embodiment of the present invention utilizes ejection pins extendable from chuck surfaces below substrate 110 to present substrate 110 in a position conducive to automated loading and/or unloading.

Although shown as two separate chucks, advantages of the present invention may be realized through the use of a single chuck assembly. For example, a single chuck apparatus consisting of a vacuum portion, substantially coextensive with chuck 610 shown in FIG. 6, and a bead forming portion, substantially coextensive with chuck 510 shown in FIG. 6, may be utilized.

It shall be appreciated that coating substrate 110 can result in the outer edges and possibly the backside due to wicking capillary action also being coated. However, this can be undesired as subsequent handling of the substrate, having its edges coated, may result in the chipping and peeling of the coating on these edges which may continue to the surface for which a uniform continuous coating is desired. Accordingly, the preferred embodiment of the present invention is adapted to discourage coating of these outer edges.

Figure 6:
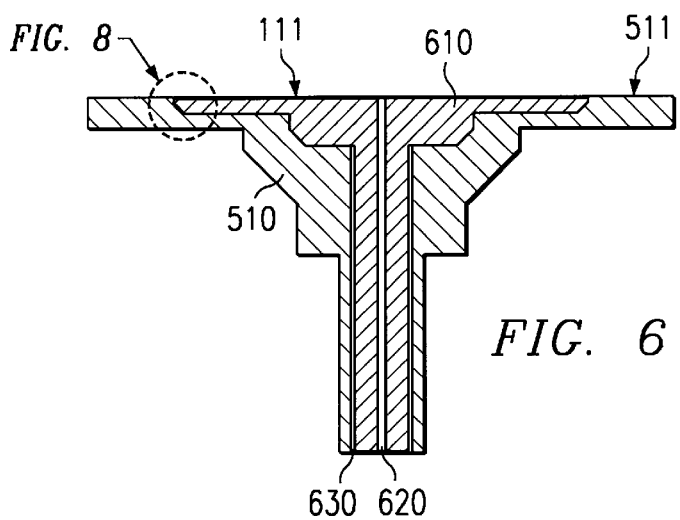
FIG. 6 shows a section view of the chuck and substrate of FIG. 5 along section line 6—6.
Figure 7:
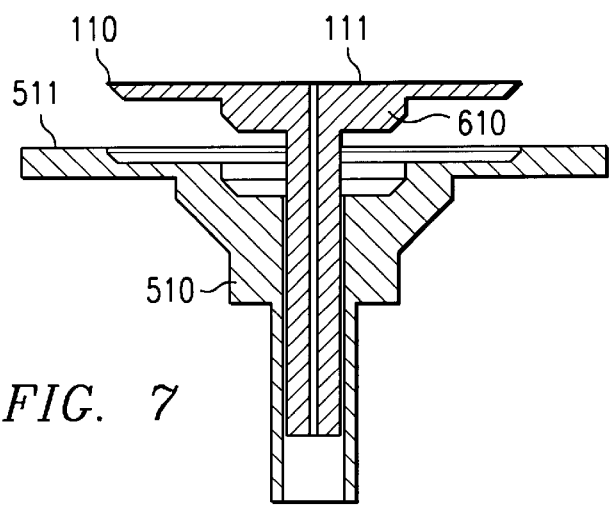
FIG. 7 shows a section view of the chuck and substrate of FIG. 5 along section line 6—6 with the bead forming surface disengaged.
Figure 8:
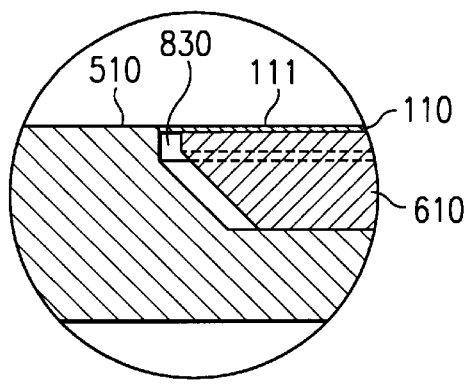
FIG. 8 shows a detail of the area of interface between the bead forming surface and substrate of FIG. 6.

Directing attention to FIG. 8, a detail of the area of FIG. 6 wherein substrate 110 nests inside of chuck 510 can be seen. Here, cavity 830 is provided beneath the edge of substrate 110 in order to provide a positive pressure therein and, thus, discourage the migration of coating material in any gap remaining between substrate 110 and chuck 510. Alternative means for introducing a positive pressure in the gap between substrate 110 and chuck 510, such as the use of gas delivery orifices disposed in the surface of chuck 510 in juxtaposition with the edge of substrate 110, may be used if desired. This positive pressure, which may be provided such as through bore 630 shown in FIG. 6, is preferably very slight, on the order of several inches of H$_2$O. Preferably, the positive pressure in cavity 830 is an amount determined to be sufficient to discourage migration of the coating material while being insufficient to cause bubbling or other undesired movement of coating 512. Likewise, the air pressure in cavity 830 is preferably selected so as not to introduce air or other gas into the extrusion orifice or extrusion material manifold 210 of extrusion head 120. Additionally, the mechanical interface between substrate 110 and chuck 510 may be designed in a way to reduce clearance between the edge of substrate 110 and chuck 510 in order to facilitate the sealing of the cavity 830. As an example, a portion of chuck 510 may extend under wafer 110 at a slight angle to constrict any opening there between.

It shall be appreciated that bead forming surface 511 of FIG. 5 is shown as a circular surface. Such a circular embodiment provides a most desirable shape for spinning as described above. Because of the potentially high rotational speeds of spinning, the circular shape of bead forming surface 511 may be desired to avoid balancing, windage, and other problems associated with other shapes, such as squares. However, as can be seen in FIG. 5, bead forming surface 511 presents surface area in addition to that required for bead forming which will require cleaning after spinning.

An alternative embodiment of the present invention utilizes a bead forming surface adapted so as to be substantially the size and shape of the coating actually deposited. Such an embodiment presents a minimum amount of bead forming surface to be cleaned and otherwise handled.

Figure 9:
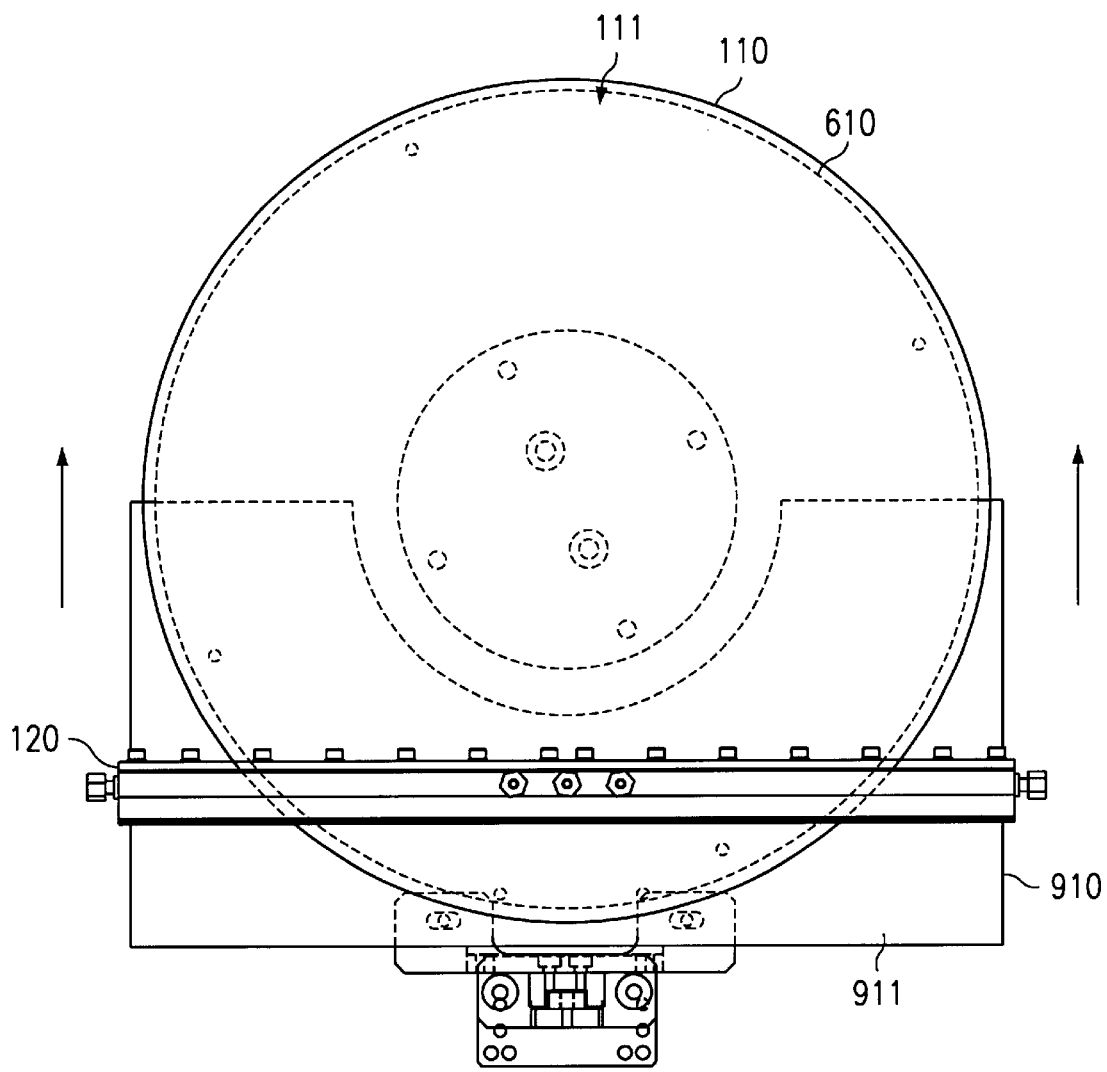
FIG. 9 shows a plan view of an alternative embodiment of a chuck of the present invention.

Directing attention to FIG. 9, an embodiment utilizing chuck 910 shaped so as to substantially correspond to the coating surface deposited by the linear movement of extrusion head 110, shown as coating 512 in FIG. 5, is shown. Accordingly, bead forming surface 911 substantially corresponds to the length of extrusion head 120.

It shall be appreciated that chuck 910 only extends along a portion of substrate 110. Accordingly, bead forming surface 911 may be utilized in forming a coating bead, with no accumulation of coating material on portions of extrusion head 110 not initially corresponding to circular surface 111, when extrusion head 110 is moved in the direction of the arrows. However, having traversed the portion of circular surface 111 where additional portions of extrusion head 110 correspond to circular surface 111, bead forming surface 911 terminates, allowing accumulation and/or dripping of coating material where it is unlikely to affect the coating of substrate 110.

However, such an embodiment may result in the coating of the exposed edges of substrate 110 and/or dripping of coating material. Accordingly, an alternative embodiment of the present invention includes a sufficient bead forming surface to avoid such accumulation and/or dripping of coating material. For example, a second chuck 910 may be disposed in cooperation with chuck 910 shown in FIG. 9. Directing attention to FIG. 10, an embodiment of the present invention including chuck 910 and chuck 910' is shown in elevation view. Here chuck 910 is held in an engaged position by pneumatic cylinder 1011 such that bead forming surface 911 and circular surface 111 present a substantially continuous surface. Chuck 910' is shown in a disengaged position. However, activation of pneumatic cylinder 1012 will result in chuck 910' moving to an engaged position such that bead forming surface 911' and circular surface 111 present a substantially continuous surface.

It shall be appreciated that providing both chuck 910 and 910' in an engaged position as extrusion head 110 deposits coating 512 will discourage accumulation of coating material on extrusion head 110 as the extrusion orifice will substantially correspond to a surface at all positions throughout the travel of extrusion head 110. Additionally, application of the aforementioned positive air pressure in a cavity in chucks 910 and 910' in juxtaposition with the edge of circular surface 111 may be utilized to further discourage migration of the coating material into any gaps remaining between bead forming surfaces 910 and 910' and circular surface 111. It shall be appreciated that as a cavity in chucks 910 and 910' for providing a positive pressure below the gap between the bead forming surface and the substrate will be interrupted at the junction of these two chucks. Accordingly, the cavity in each chuck may include a dam at these points in order to maintain a desired positive pressure even where the other one of the chucks is disengaged. Alternatively, the aforementioned gas delivery orifices may be used to provide more localized areas of positive pressure less affected by the discontinuation of the chuck.

Figure 10:
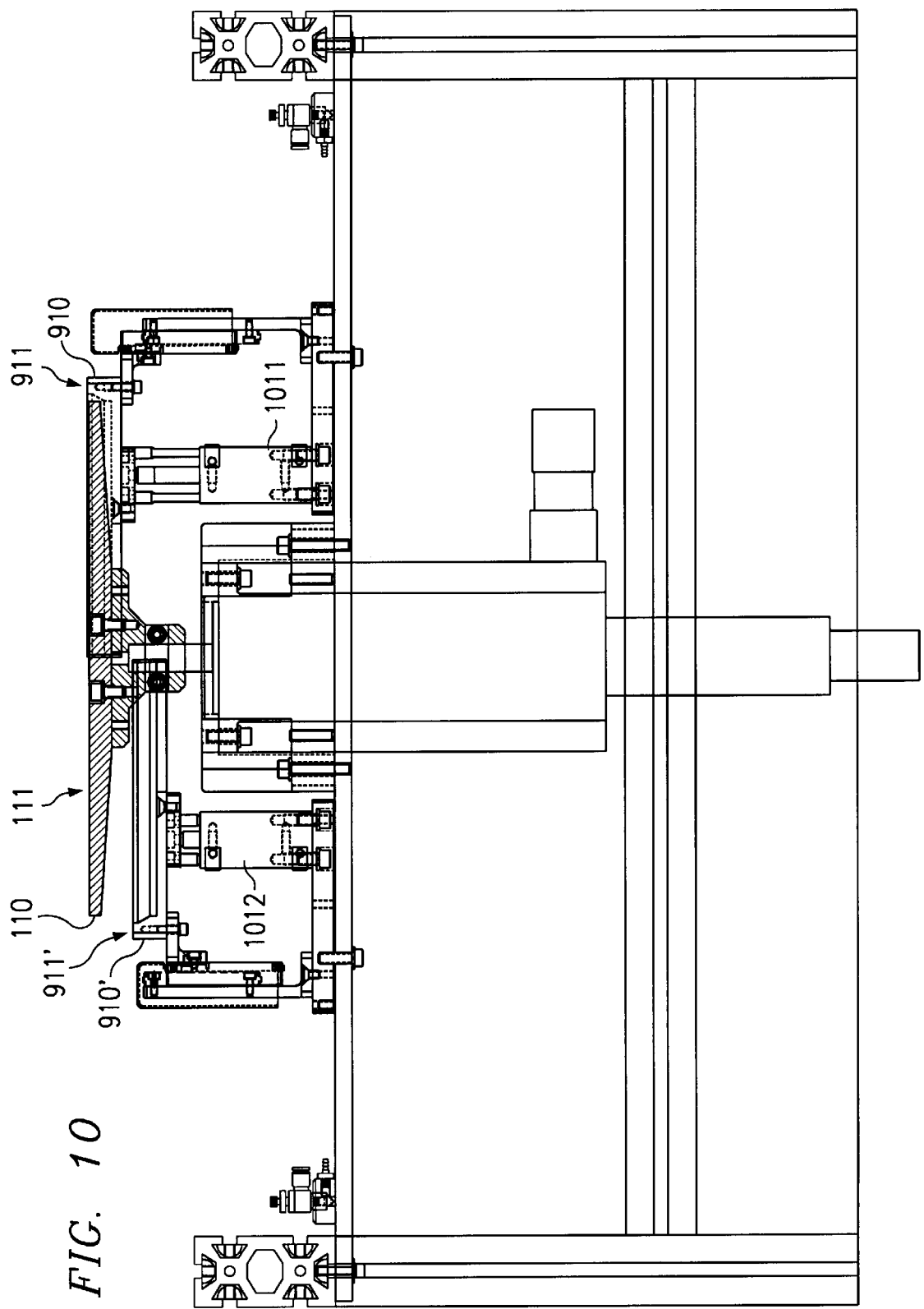
FIG. 10 shows an elevation view of the chuck of FIG. 9.

Illustrated in FIG. 10 is a multi-piece embodiment of a chuck shaped so as to substantially correspond to the coating surface deposited by the linear movement of extrusion head 110. It shall be appreciated that a chuck so shaped may be utilized according to the present invention which presents a single bead forming surface, if desired. However, use of a multi-piece chuck, such as illustrated in FIG. 10, may be desirable.

For example, a speed at which successive coating cycles are accomplished may be improved through the use of the multi-piece. Here the coating bead may be initially formed on bead forming surface 911 while chuck 910' is not yet in the fully engaged position. Thereafter, before extrusion head 110 traverses bead forming surface 911, chuck 910' may be presented in the engaged position. After extrusion head 110 traverses bead forming surface 911 completely, chuck 910 may be withdrawn from the engaged position while extrusion head 110 is still traversing extrusion surface 911'. Accordingly, the time during which it takes extrusion head 110 to traverse either of bead forming surfaces 911 or 911', the other one of bead forming surfaces 911 or 911' may be operated upon, such as cleaned or otherwise prepared for a subsequent cycle.

It shall be appreciated that an improved ratio of use to waste for the coating material dispensed utilizing extrusion or extrusion and spin of the present invention as compared to that of the prior art spin technique. However, the ratio of use to waste may be further improved while still providing the desired uniform coating of the substrate through the use of a bead forming surface reduced over that of the embodiments shown above.

Referring again to FIG. 3, it can be seen that horseshoe area 330, having a thickness greater than that of the remaining coating 130 due to the accumulation of coating material on extrusion head 120 prior to its correspondence to circular surface 111, affects only a small area of circular surface 111. Additionally, horseshoe area 330 substantially follows the leading edge of substrate 110 as presented to extrusion head 120 during its linear travel. Accordingly, it is possible to both predict, such as through experimentation, and alter, such as through manipulation of the leading edge presented extrusion head 120, the shape of this area of thicker coating associated with the accumulation of coating material.

Figure 11:
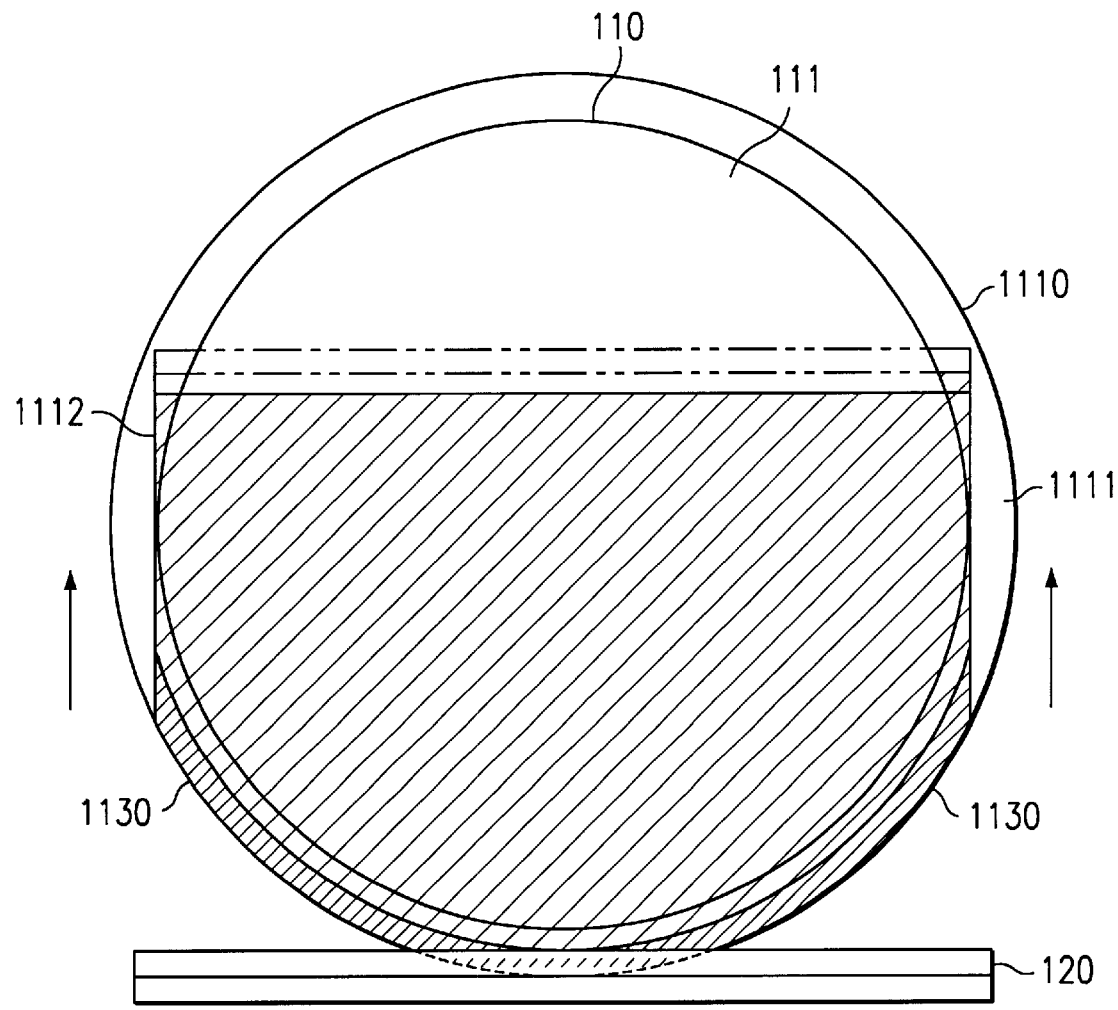
FIG. 11 shows a plan view of an alternative embodiment of a chuck of the present invention.

Directing attention to FIG. 11, an alternative embodiment of the present invention providing bead forming surface 1111 on chuck 1110 is shown in plan view. Bead forming surface 1111 is adapted to present a leading edge and sufficient surface such that horseshoe area 1130, having a thickness greater than that of the remaining coating 1112 due to the accumulation of coating material on extrusion head 120 prior to its correspondence to bead forming surface 1111 and/or circular surface 111, is contained upon bead forming surface 1111. Accordingly, extrusion head 120 may deposit coating 1112, completely coating circular surface 111 of substrate 110, in a single linear motion without the accumulation of coating material on extrusion head 120 at portions not initially corresponding to bead forming surface 1111 and/or circular surface 111 causing undesired irregularities in the coating as deposited on circular surface 111. Therefore, substrate 110 may be removed from chuck 1110 after a single pass of extrusion head 120 having deposited thereon a coating of substantially uniform thickness with or without further processing as described above.

This preferred embodiment of the present invention allows for the use of a chuck, and therefore a corresponding bead forming surface, which is reduced in size. This reduction in size provides advantages as a smaller amount of coating material is deposited on the bead forming surface, and therefore reduces waste of such coating material. Additionally, cleaning of the reduced in size chuck is improved as there is less surface and coating material to clean, improving cleaning time and effort as well as reducing the amount of cleaning solvents etc. required.

Furthermore, the reduced in size chuck provides advantages not readily apparent from the illustration of FIG. 11. Specifically, it is anticipated that the present invention will be deployed in existing or currently designed manufacturing equipment. These pieces of equipment include certain size constraints for the items which may be placed in the working area. For example, the aforementioned spin bowl may be limited in diameter such that the embodiment of FIG. 5 will not fit. Likewise, as hazardous and unstable materials may be involved in the coating of the substrate, ventilation may be carefully controlled within and around these machines. Particular sizes of items placed within the work area of one of these machines may result in undesired ventilation flow or its blockage. Accordingly, the embodiment of FIG. 11 presents a minimum amount of additional surface for the bead forming of the present invention in order to be compatible with a great number of the aforementioned machines.

It shall be appreciated that the embodiment illustrated in FIG. 11 includes a circular shaped chuck 1110. As described above, this shape provides for the simplified cleaning of the bead forming surface through spinning. Of course, other shapes of reduced in size chucks may be utilized where determined to provide a desired coating of substrate 110, if desired. For example, a chuck which presents a leading edge substantially conforming to the shape of the extrusion head and providing sufficient bead forming surface for accumulated material to be removed from the extrusion head prior to traversing the substrate may be used.

Likewise, it should be appreciated that any of the chucks may be of a size and/or shape different than those illustrated and described with respect to the examples used herein. Where substrates of shapes other than the circular shape of the example substrate described herein are used, the chucks of the present invention may be altered accordingly. For example, the bead forming surface of a chuck used according to the present invention may be adapted to an irregular shaped substrate. Such adaptation may include the bead forming surface providing a recessed portion substantially matching the circumferential edge of the substrate to allow the bead forming surface and the surface of the substrate to form a substantially continuous surface. Additionally, or alternatively, the circumferential edge of the chuck, or a portion thereof, may be shaped to correspond to the circumferential edge of the substrate.

It should be appreciated that any of the chucks of the present invention may be multi-part, such as described with respect to FIGS. 9 and 10 above. Likewise, any of the chucks of the present invention may utilize positive pressure to discourage migration of coating material, such as described with respect to FIG. 8 above.

Although the present invention and its advantages have been described in detail, it should be understood that various changes, substitutions and alterations can be made herein without departing from the spirit and scope of the invention as defined by the appended claims.

What is claimed is:

1. A method for depositing a uniform coating having a predetermined thickness on a substrate, said method comprising the steps of:

providing substantially linear relative motion of a coating device with respect to said substrate, wherein said linear relative motion step causes said coating device to traverse a surface of said substrate to be coated;

dispensing a coating material at a controlled rate from said dispensing device, wherein dispensing of said coating material from said dispensing device provides coating material sufficient to entirely cover said surface of said substrate to be coated in a single iteration of said linear relative motion; and capturing coating material dispensed from said coating device unnecessary for coating said surface of said substrate to be coated with said predetermined thickness, wherein said capturing step comprises the step of:
  interfacing a capturing surface with said substrate to present a substantially continuous composite surface with said surface of said substrate to be coated during at least a portion of said relative linear motion step; and
  separating portions of said capturing surface, wherein ones of said portions of said surface may interface with said surface to be coated while other ones of said portions of said capturing surface may be uninterfaced from said surface of said substrate to be coated.

2. The method of claim 1, wherein said linear relative motion of said dispensing means is substantially orthogonal to said dimension of said dispensing means corresponding to said width of said surface of said substrate to be coated.

3. The method of claim 1, wherein said dispensing step is adapted to restrict delivery of at least a portion of said coating material unnecessary for coating said surface of said substrate to be coated.

4. A method for depositing a uniform coating having a predetermined thickness on a substrate, said method comprising the steps of:
  providing substantially linear relative motion of a coating device with respect to said substrate, wherein said linear relative motion step causes said coating device to traverse a surface of said substrate to be coated;
  dispensing a coating material at a controlled rate from said dispensing device, wherein dispensing of said coating material from said dispensing device provides coating material sufficient to entirely cover said surface of said substrate to be coated in a single iteration of said linear relative motion;
  discouraging said coating material from infiltrating a gap between said capturing surface and said surface of said substrate to be coated; and
  capturing coating material dispensed from said coating device unnecessary for coating said surface of said substrate to be coated with said predetermined thickness, wherein said capturing step comprises the step of:
    interfacing a capturing surface with said substrate to present a substantially continuous composite surface with said surface of said substrate to be coated during at least a portion of said relative linear motion step.

5. The method of claim 4 wherein said discouraging means comprises:
  creating a positive pressure beneath said gap.

6. The method of claim 4, wherein the step of discouraging coating material infiltrating the gap relies at least in part on a tapered surface of said capturing surface adapted to interface with the substrate.

7. A system for coating a substrate, said system comprising
  a bead forming surface adapted to interface with said substrate to present a substantially continuous surface composed of said bead forming surface and a surface of said substrate to be coated wherein said bead forming surface is a surface of a removable shim;
  an extrusion head; and
  movement mechanism disposing said extrusion head a selected distance from said bead forming surface to allow a coating bead to be formed between said extrusion head and said bead forming surface.

8. A system for coating a substrate, said system comprising
  a bead forming surface adapted to interface with said substrate to present a substantially continuous surface composed of said bead forming surface and a surface of said substrate to be coated wherein said bead forming surface includes a plurality of separable sub-sections;
  an extrusion head; and
  movement mechanism disposing said extrusion head a selected distance from said bead forming surface to allow a coating bead to be formed between said extrusion head and said bead forming surface.

9. A system for coating a substrate, said system comprising:
  a bead forming surface adapted to interface with said substrate to present a substantially continuous surface composed of said bead forming surface and a surface of said substrate to be coated, wherein said bead forming surface is a surface of a chuck adapted to receive said substrate nested therein and said chuck includes multiple portions at least two of which include a portion of said bead forming surface;
  an extrusion head; and
  movement mechanism disposing said extrusion head a selected distance from said bead forming surface to allow a coating bead to be formed between said extrusion head and said bead forming surface.

10. The system of claim 9, further comprising:
  a chuck engaging mechanism adapted to engage a first portion of said chuck to correspond with a portion of said linear movement of said extrusion head and to engage a second portion of said chuck to correspond with another portion of said linear movement of said extrusion head.

11. A system for coating a substrate, said system comprising:
  a bead forming surface adapted to interface with said substrate to present a substantially continuous surface composed of said bead forming surface and a surface of said substrate to be coated, wherein said bead forming surface is a surface of a chuck adapted to receive said substrate nested therein and;
  means for introducing a positive pressure in an area adjacent to a circumferential edge of said substrate;
  an extrusion head; and
  movement mechanism disposing said extrusion head a selected distance from said bead forming surface to allow a coating bead to be formed between said extrusion head and said bead forming surface.

12. The system of claim 11, pressure introducing means comprises:
  a cavity substantially corresponding to said circumferential edge of said substrate; and
  a positive pressure located in said cavity.

13. The system of claim 12, further comprising:
  means for constricting an opening associated with the area adjacent to the circumferential edge of said substrate.

14. The system of claim 13, wherein said constricting means comprising:
  a tapered receiving surface of said chuck.

15. A system for coating a substrate, said system comprising:
  a bead forming surface adapted to interface with said substrate to present a substantially continuous surface composed of said bead forming surface and a surface of said substrate to be coated;

an extrusion head wherein said extrusion head is adapted to deposit a coating material according to a predetermined gradient; and movement mechanism disposing said extrusion head a selected distance from said bead forming surface to allow a coating bead to be formed between said extrusion head and said bead forming surface.

16. A system for coating a substrate, said system comprising:

a bead forming surface adapted to interface with said substrate to present a substantially continuous surface composed of said bead forming surface and a surface of said substrate to be coated;

an extrusion head wherein said extrusion head is adapted to deposit varying amount of coating material corresponding with the surface to be coated; and movement mechanism disposing said extrusion head a selected distance from said bead forming surface to allow a coating bead to be formed between said extrusion head and said bead forming surface.

17. A system for depositing a uniform coating having a predetermined thickness on a substrate, said system comprising:

means for dispensing a coating material at a controlled rate, wherein a dimension of said dispensing means substantially corresponds to a width of a surface of said substrate to be coated, wherein said dispensing means includes means for controlling the dispensation of coating material dispensed from said dispensing means to correspond to said surface of said substrate to be coated, wherein said controlling means is adapted to restrict delivery of at least a portion of the coating material unnecessary for coating said surface of said substrate to be coated with said predetermined thickness; and means for providing substantially linear relative motion of said dispensing means with respect to said substrate, said linear relative motion of said dispensing means being substantially orthogonal to said dimension of said dispensing means corresponding to said width of said surface of said substrate to be coated, wherein said linear relative motion causes said dispensing means to traverse said surface of said substrate to be coated.

18. The system of claim 17, wherein said motion providing means comprises:

adjustable control of said relative motion of said dispensing means.

19. The system of claim 18, which said adjustable control controls a relative velocity of said dispensing means.

20. The system of claim 18, wherein said adjustable control controls a distance between said dispensing means and said surface of said substrate to be coated.

21. The system of claim 17, wherein said dispensing means comprises:

a fixed gradient flow extrusion head.

22. The system of claim 17, wherein said dispensing means comprises:

a flexible extrusion head.

23. The system of claim 17, wherein said dispensing means comprises:

an adjustable flow extrusion head.

24. The system of claim 23, wherein said adjustable flow extrusion head includes movable members operable to increase/decrease the effective size of an extrusion orifice.

25. A system for depositing a uniform coating having a predetermined thickness on a substrate, said system comprising:

a gradient flow extrusion die for dispensing a coating material at a controlled rate, wherein a dimension of said dispensing means substantially corresponds to a width of a surface of said substrate to be coated;

means for providing substantially linear relative motion of said dispensing means with respect to said substrate, said linear relative motion of said dispensing means being substantially orthogonal to said dimension of said dispensing means corresponding to said width of said surface of said substrate to be coated, wherein said linear relative motion causes said dispensing means to traverse said surface of said substrate to be coated; and means for capturing coating material dispensed from said dispensing means, wherein said capturing means is adapted to capture at least a portion of the coating material unnecessary for coating said surface of said substrate to be coated with said predetermined thickness, wherein said capturing means comprises:

a surface adapted to receive said substrate and present a substantially continuous composite surface with said surface of said substrate to be coated during at least a portion of said relative linear motion of said dispensing means.

26. A system for depositing a uniform coating having a predetermined thickness on a substrate, said system comprising:

means for dispensing a coating material at a controlled rate, wherein a dimension of said dispensing means substantially corresponds to a width of a surface of said substrate to be coated;

means for providing substantially linear relative motion of said dispensing means with respect to said substrate, said linear relative motion of said dispensing means being substantially orthogonal to said dimension of said dispensing means corresponding to said width of said surface of said substrate to be coated, wherein said linear relative motion causes said dispensing means to traverse said surface of said substrate to be coated; and means for capturing coating material dispensed from said dispensing means, wherein said capturing means is adapted to capture at least a portion of the coating material unnecessary for coating said surface of said substrate to be coated with said predetermined thickness, wherein said capturing means comprises:

a surface adapted to receive said substrate and present a substantially continuous composite surface with said surface of said substrate to be coated during at least a portion of said relative linear motion of said dispensing means; and means for separating portions of said surface, wherein ones of said portions of said surface may receive said substrate while other ones of said portions of said surface ma be disengaged from receiving said substrate.

27. A system for depositing a uniform coating having a predetermined thickness on a substrate, said system comprising:

means for dispensing a coating material at a controlled rate, wherein a dimension of said dispensing means substantially corresponds to a width of a surface of said substrate to be coated;

means for providing substantially linear relative motion of said dispensing means with respect to said substrate, said linear relative motion of said dispensing means being substantially orthogonal to said dimension of said dispensing means corresponding to said width of said surface of said substrate to be coated, wherein said linear relative motion causes said dispensing means to traverse said surface of said substrate to be coated;

means for discouraging said coating material from infiltrating a gap between said surface and said surface of said substrate to be coated; and means for capturing coating material dispensed from said dispensing means, wherein said capturing means is adapted to capture at least a portion of the coating material unnecessary for coating said surface of said substrate to be coated with said predetermined thickness, wherein said capturing means comprises:

a surface adapted to receive said substrate and present a substantially continuous composite surface with said surface of said substrate to be coated during at least a portion of said relative linear motion of said dispensing means.

28. The system of claim 27, wherein said discouraging means comprises:

means for creating a positive pressure beneath said gap.

29. The system of claim 27, wherein said discouraging means comprises:

means for constricting the gap between said surface and said surface of said substrate to be coated.

30. The system of claim 29 wherein said constricting means comprises:

a tapered portion of said surface.

31. An extrusion system for coating a circular substrate with a coating having a desired thickness with a linear extrusion motion, said system comprising:

an extrusion head having a linear extrusion orifice and coupled to a linear movement mechanism, wherein linear movement provided by said linear movement mechanism is substantially orthogonal to said linear extrusion orifice;

a chuck assembly including a surface to receive coating material extruded from said extrusion head during said linear movement, wherein said surface includes a recess adapted to correspond to a size of said circular substrate and to nest said substrate therein to thereby present a substantially continuous composite surface of said extrusion head; and a cavity having a pressure greater than ambient pressure disposed in juxtaposition with the interface between said coating material receiving surface and said substrate.

32. The system of claim 31, wherein said coating material receiving surface is circular.

33. The system of claim 32, wherein the size of said circular receiving surface is predetermined to be a minimum size to allow a coating bead formed from an interface of said extrusion head and said coating material receiving surface to substantially reach a steady state before said linear motion brings said coating bead in contact with said substrate.

34. The system of claim 32, wherein said composite surface is, at all points corresponding to the linear movement of said extrusion head, as wide as said linear orifice.

35. The system of claim 31, wherein said composite surface substantially corresponds to a coating pattern associated with the linear movement of said extrusion head.

36. The system of claim 31, wherein said chuck assembly is a multiple part chuck.

37. The system of claim 36, wherein at least two parts of said chuck assembly include a portion of said receiving surface.

38. The system of claim 36, wherein said multiple part chuck comprises:

an inner vacuum chuck adapted to grip said substrate with a vacuum; and an outer coating bead forming chuck slidably coupled to said vacuum chuck, wherein said cavity is disposed at an interface of said inner vacuum chuck and said outer coating bead forming chuck.

39. The system of claim 31, wherein the chuck is adapted for substantially automated cleaning of said coating material from said surfaces to receive said coating material.

40. The system of claim 39, wherein the surface to receive said coating material is provided with a wetting resistant material.

41. The system of claim 39, wherein the chuck is adapted for spinning to expel coating material from said surface to receive said coating material.

42. The system of claim 31, wherein said coating material receiving surface is associated only with a first portion of said linear movement of said extrusion head.

* * * * *